US010069458B2

(12) United States Patent
Sato et al.

(10) Patent No.: US 10,069,458 B2
(45) Date of Patent: Sep. 4, 2018

(54) INVERTER AND PHOTOVOLTAIC APPARATUS

(71) Applicant: Kabushiki Kaisha Toshiba, Minato-ku, Tokyo (JP)

(72) Inventors: Koichi Sato, Tachikawa Tokyo (JP); Shingo Yanagimoto, Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 163 days.

(21) Appl. No.: 14/931,085

(22) Filed: Nov. 3, 2015

(65) Prior Publication Data
US 2016/0324020 A1 Nov. 3, 2016

(30) Foreign Application Priority Data
Apr. 28, 2015 (JP) .................................. 2015-091371

(51) Int. Cl.
*H02S 40/34* (2014.01)
*H02S 40/32* (2014.01)
*H05K 7/14* (2006.01)

(52) U.S. Cl.
CPC .............. *H02S 40/34* (2014.12); *H02S 40/32* (2014.12); *H05K 7/1432* (2013.01)

(58) Field of Classification Search
CPC ........ H05K 7/1432; H02S 40/34; H02S 40/32
USPC ........... 361/679.01, 752, 807; 136/243, 244; 343/872
See application file for complete search history.

(56) References Cited

U.S. PATENT DOCUMENTS

| 8,462,518 | B2* | 6/2013 | Marroquin | H05K 7/10 136/243 |
| 8,929,094 | B2* | 1/2015 | Marroquin | H05K 7/10 136/244 |
| 9,343,600 | B2* | 5/2016 | Zhang | H01L 31/024 |
| 9,454,723 | B1* | 9/2016 | Cordes | H04B 5/0062 |
| 2002/0186020 | A1* | 12/2002 | Kondo | H02S 40/32 324/538 |
| 2003/0083023 | A1* | 5/2003 | Chang | H01Q 1/244 455/90.1 |

(Continued)

FOREIGN PATENT DOCUMENTS

| JP | 07-030557 U | 6/1995 |
| JP | 2002-141538 A | 5/2002 |

(Continued)

*Primary Examiner* — Steven T Sawyer
*Assistant Examiner* — Sagar Shrestha
(74) *Attorney, Agent, or Firm* — Knobbe, Martens, Olson & Bear, LLP

(57) ABSTRACT

According to one embodiment, an inverter includes a housing having a corner, a DC terminal, an electronic component, an AC terminal, a wireless communication module, and a projection mechanism. The DC terminal inputs DC power. The electronic component converts the DC power input to the DC terminal into AC power. The AC terminal outputs the AC power from the electronic component to the outside of the housing. The wireless communication module includes an antenna which receives or transmits a signal for controlling the electronic component. The projection mechanism projects at least a part of the antenna into the outside of the housing. The projection mechanism is provided in a portion of the housing other than the corner.

12 Claims, 11 Drawing Sheets

(56) References Cited

U.S. PATENT DOCUMENTS

| | | | |
|---|---|---|---|
| 2007/0057854 A1* | 3/2007 | Oodachi | H01Q 1/243 343/702 |
| 2009/0084426 A1* | 4/2009 | Fornage | H01L 31/052 136/244 |
| 2010/0263704 A1* | 10/2010 | Fornage | H02S 40/32 136/244 |
| 2011/0083733 A1* | 4/2011 | Marroquin | H05K 7/10 136/256 |
| 2012/0223865 A1* | 9/2012 | Li | H01Q 1/243 343/702 |
| 2013/0201063 A1 | 8/2013 | Mikami | |
| 2013/0255749 A1* | 10/2013 | Kinyon | H05K 7/2039 136/246 |
| 2013/0271926 A1* | 10/2013 | Marroquin | H05K 7/10 361/747 |
| 2014/0361933 A1* | 12/2014 | Zhang | H01Q 1/243 343/702 |
| 2015/0163949 A1* | 6/2015 | Zhang | H01L 31/024 361/622 |
| 2015/0311861 A1* | 10/2015 | Nam | H02S 40/32 136/251 |
| 2017/0093333 A1* | 3/2017 | Marroquin | H02S 40/34 |

FOREIGN PATENT DOCUMENTS

| | | |
|---|---|---|
| JP | 2007-012710 A | 1/2007 |
| JP | 2013-162276 A | 8/2013 |

* cited by examiner

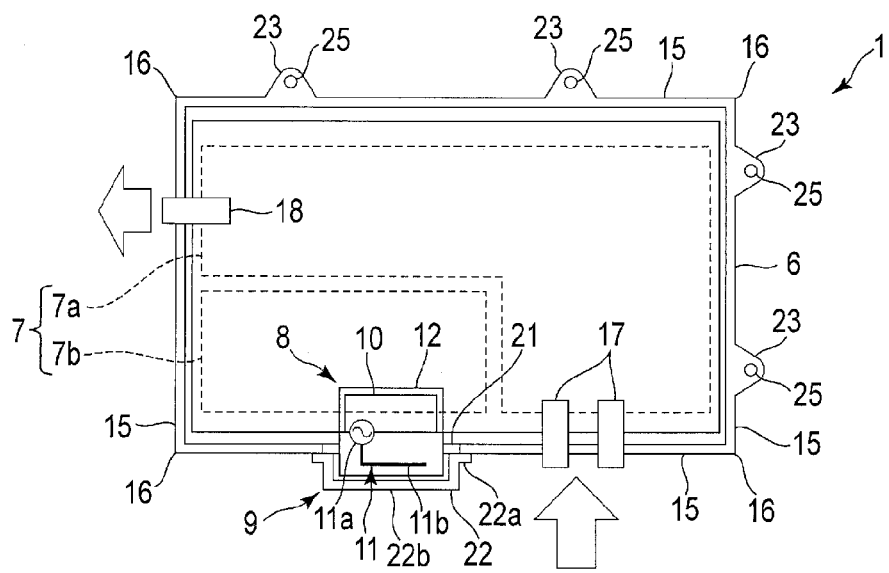
F I G. 1
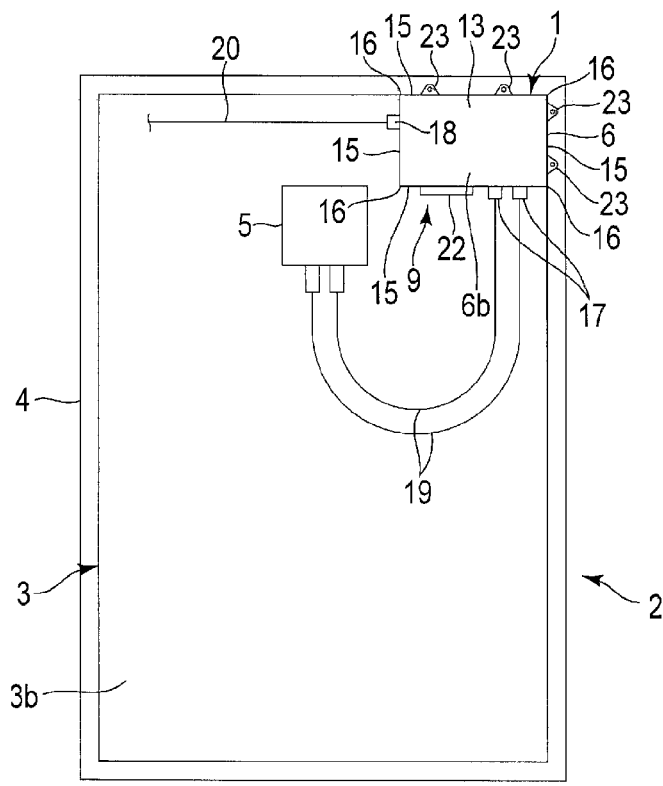
F I G. 2

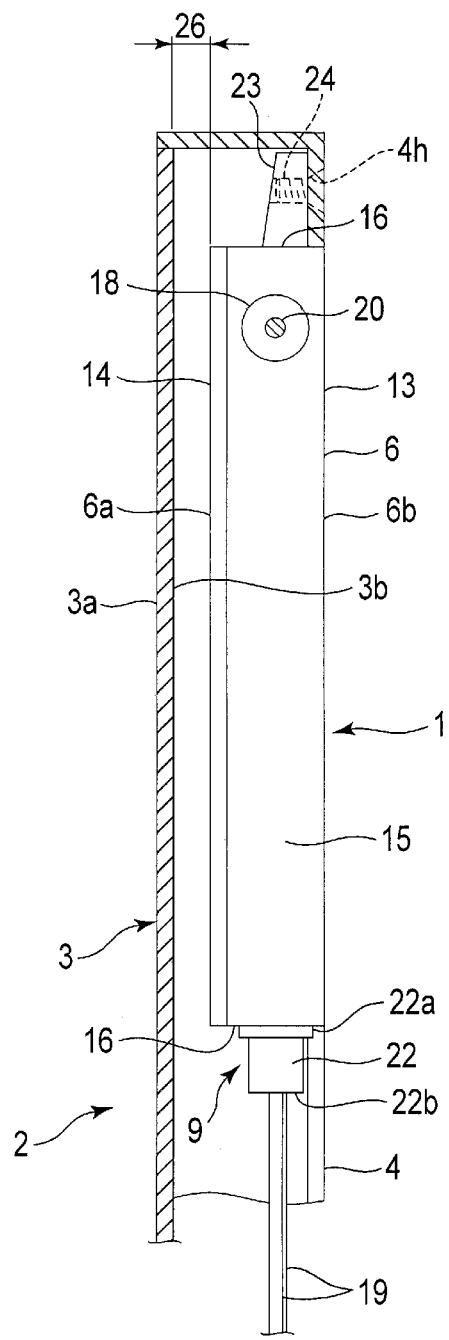
F I G. 4

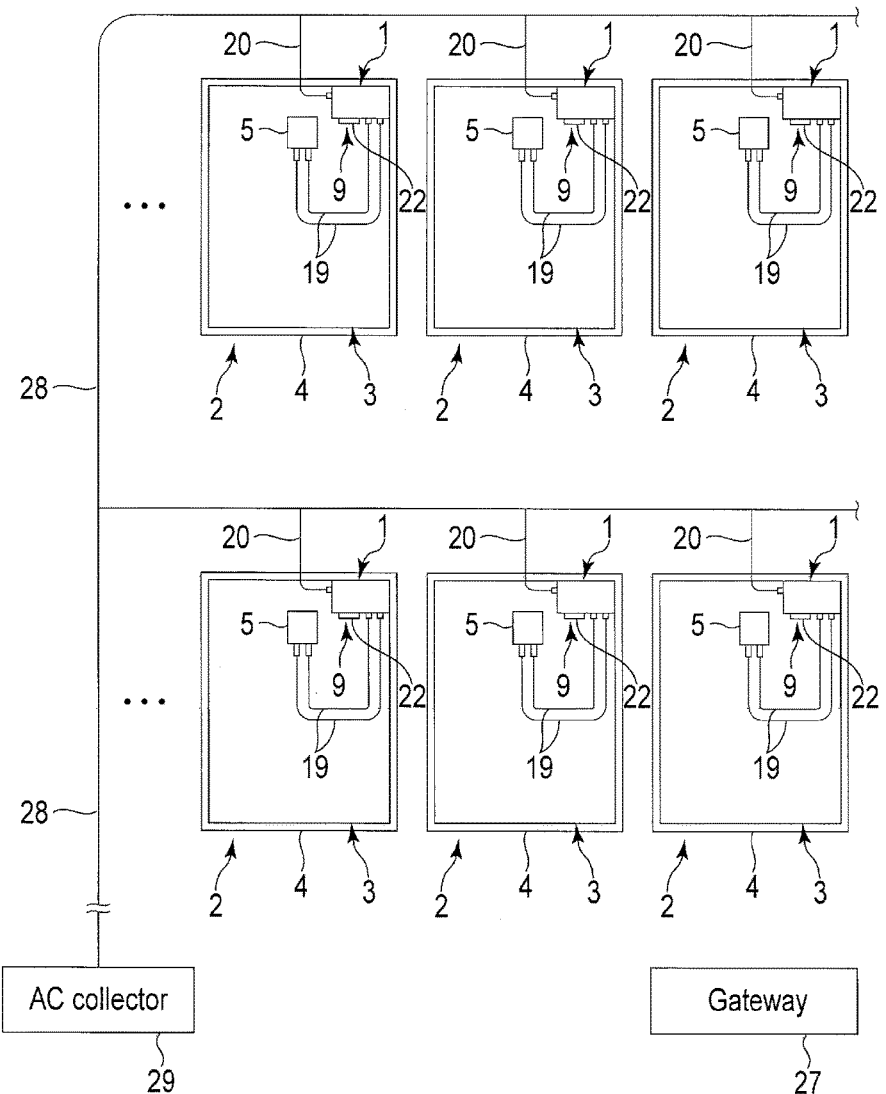
F I G. 5

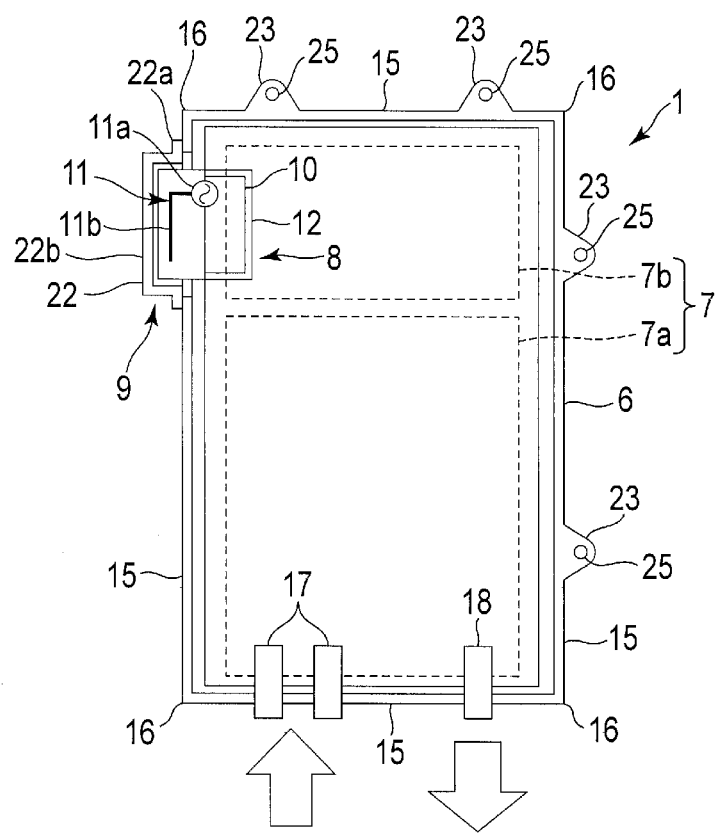
F I G. 8

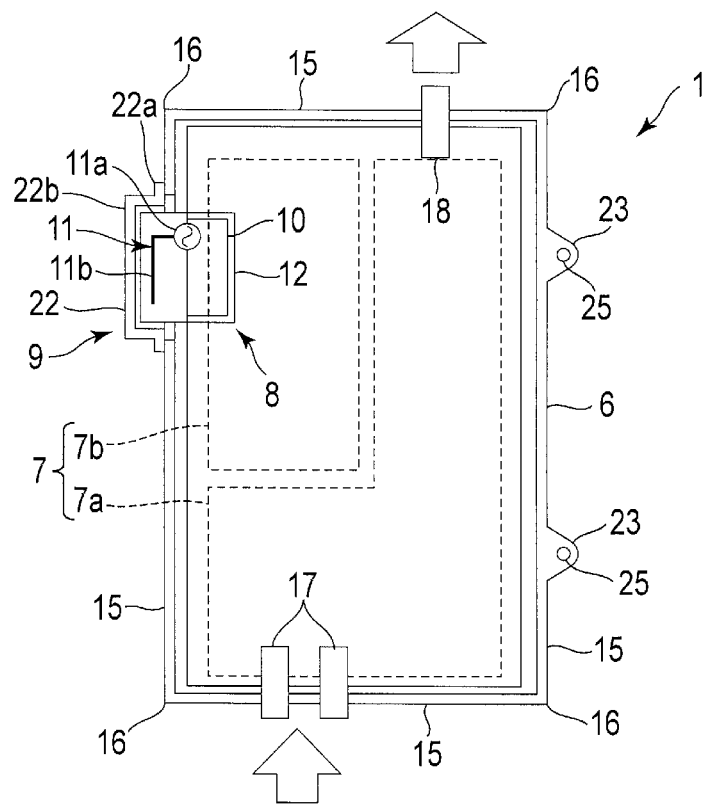
F I G. 10

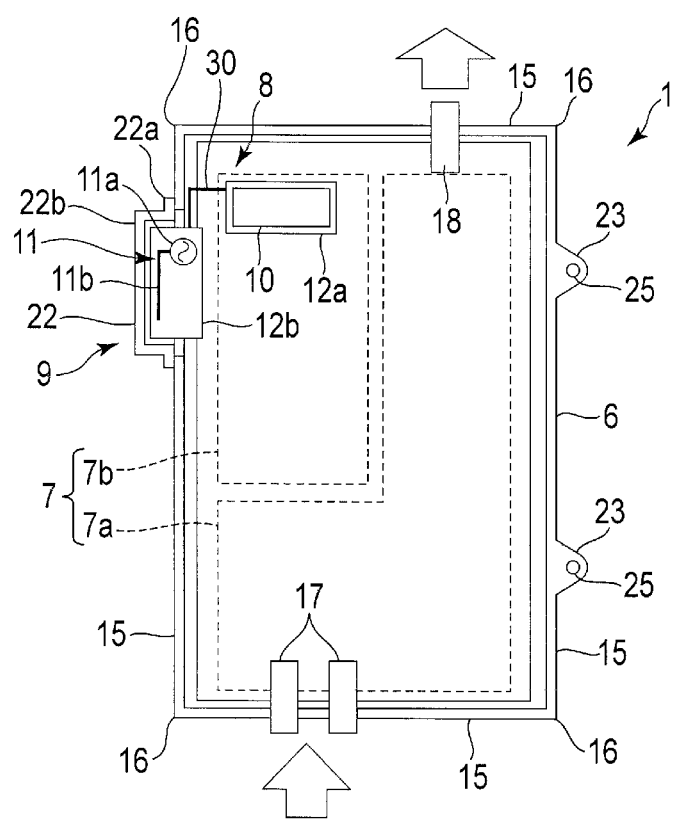
F I G. 12

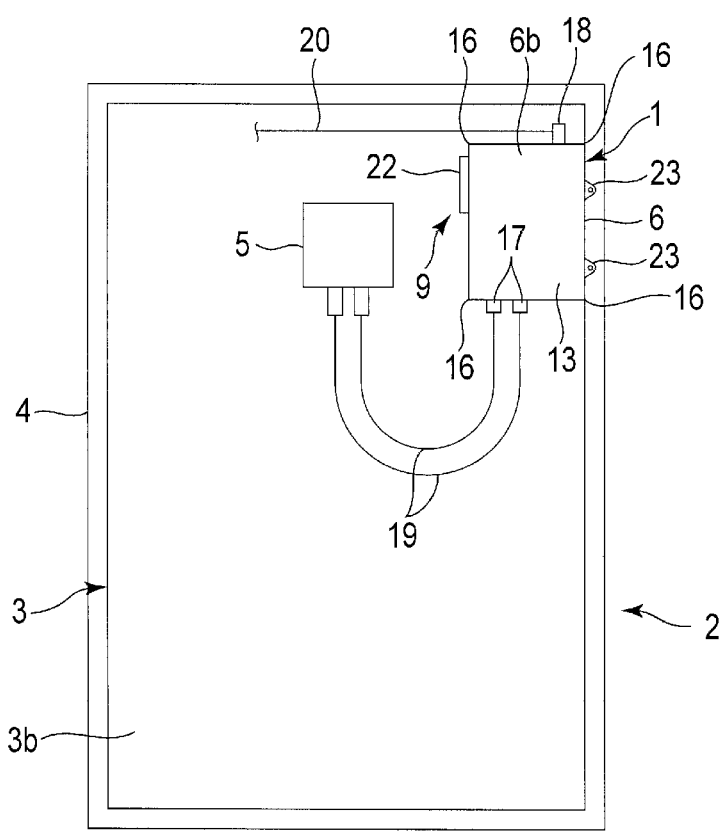
F I G. 13

INVERTER AND PHOTOVOLTAIC APPARATUS

CROSS-REFERENCE TO RELATED APPLICATIONS

This application is based upon and claims the benefit of priority from Japanese Patent Application No. 2015-091371, filed Apr. 28, 2015, the entire contents of which are incorporated herein by reference.

FIELD

Embodiments described herein relate generally to an inverter and a photovoltaic apparatus comprising the inverter.

BACKGROUND

For example, various systems configured to obtain power from power generators such as solar cells and fuel cells are known. One example of the systems is a centralized control system configured to integrally control a plurality of solar panels by a power conditioner. In a centralized control system, all the direct current (DC) power generated by a plurality of solar panels is collectively converted into alternating direct (AC) power by a single power conditioner.

These days, a new system such as a decentralized control system has been gathering attention as an alternative to the above-described centralized control system. In a decentralized control system, inverters are connected respectively to a plurality of solar panels. The inverters convert DC power into AC power individually for the respective solar panels.

Further, in the decentralized control system, there is demand for a technique to perform power generation control or monitoring of each solar panel using wireless communication. In response to the demand for the technique, a method of, for example, providing an inverter with a wireless communication module has been proposed. In this method, a wireless communication module is accommodated in a housing together with an inverter circuit.

In this case, the housing needs to be made of a metal material to maintain a certain strength (rigidity) for the entire housing. In a wireless communication module, a portion effective as an antenna (antenna portion) is required to achieve high antenna performance or wireless communication performance. Note that the antenna performance is degraded when the antenna portion approaches the housing (metal). The wireless communication performance is degraded when the antenna portion is influenced by noises produced by the inverter.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 1 is an exemplary plan view of the internal structure of an inverter of an embodiment.

FIG. 2 is an exemplary plan view of the back surface side of a photovoltaic apparatus of an embodiment.

FIG. 4 is a sectional view taken along line F4-F4 of FIG. 3.

FIG. 5 is a plan view of the structure of a wireless power generation system comprising a plurality of photovoltaic apparatuses.

FIG. 8 is an exemplary plan view of the internal structure of an inverter of a second modified example.

FIG. 10 is an exemplary plan view of the internal structure of an inverter of a third modified example.

FIG. 12 is an exemplary plan view of the internal structure of an inverter of a fourth modified example.

FIG. 13 is an exemplary plan view of the back surface side of a photovoltaic apparatus of a fourth modified example.

DETAILED DESCRIPTION

Figure 3:
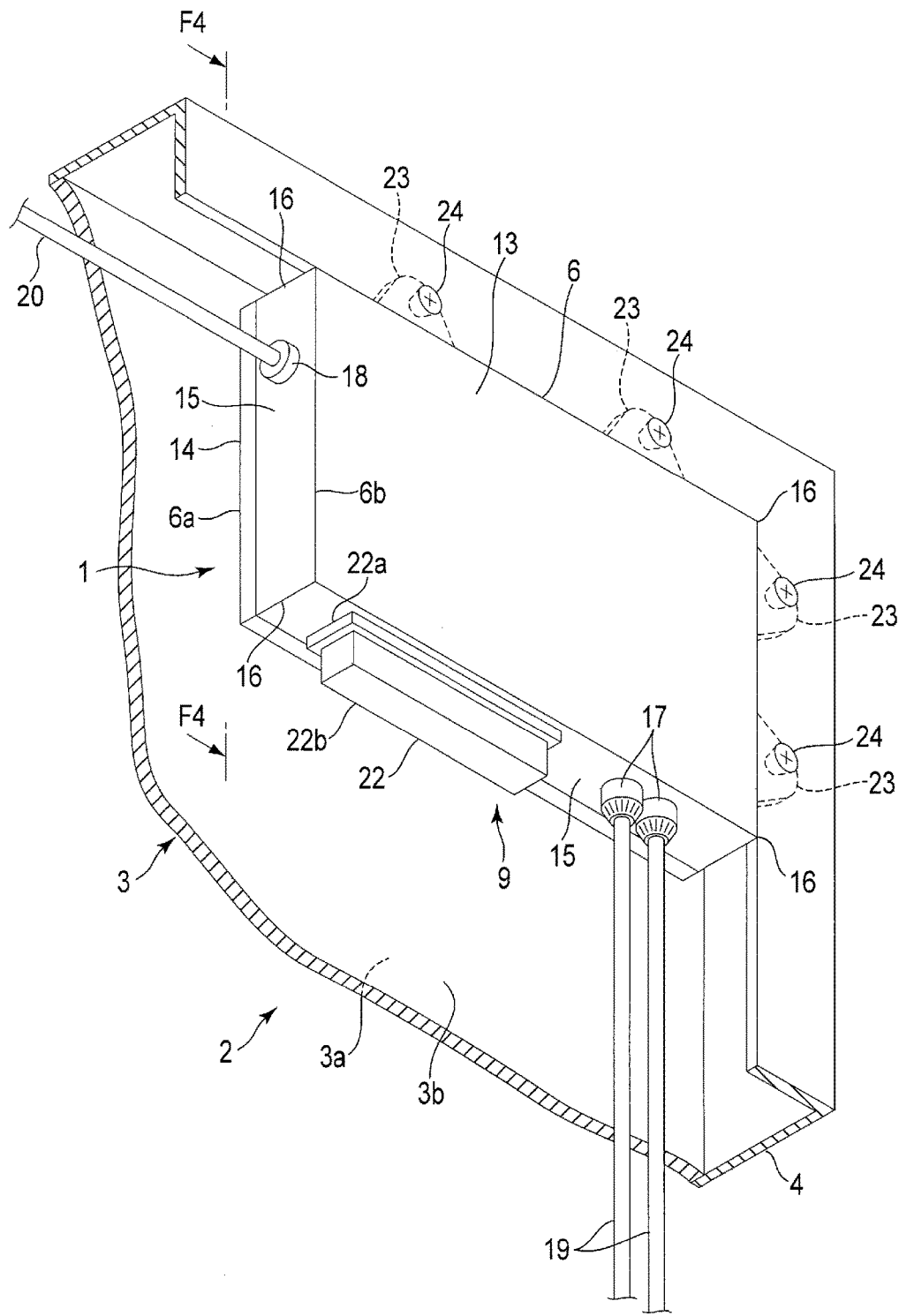
FIG. 3 is an enlarged perspective view of a part of the inverter and its surrounding structure of FIG. 2.

Various embodiments will be described hereinafter with reference to the accompanying drawings. In general, according to one embodiment, an inverter includes: a housing having a corner; a DC terminal, an electronic component; an AC terminal; a wireless communication module; and a projection mechanism. The DC terminal inputs DC power. The electronic component converts the DC power input to the DC terminal into AC power. The AC terminal outputs the AC power from the electronic component to the outside of the housing. The wireless communication module includes an antenna which receives or transmits a signal for controlling the electronic component. The projection mechanism projects at least a part of the antenna into the outside of the housing. The projection mechanism is provided in a portion of the housing other than the corner.

FIG. 1 illustrates an inverter 1 of an embodiment. FIG. 2 illustrates a photovoltaic apparatus 2 of an embodiment. The photovoltaic apparatus 2 comprises the inverter 1 and a solar panel 3. The solar panel 3 has such a structure as to integrally support a plurality of solar cell elements called cells (not shown) by a frame 4. Note that each solar cell element (in other words, photovoltaic power generator) is a semiconductor (in other words, semiconductor device) configured to output an electrical signal (DC power) based on the amount of light received when, for example, sun light enters. Further, note that the solar panel 3 comprises an entrance surface 3a and a back surface 3b on the side opposite to the entrance surface 3a. FIG. 2 illustrates a structure on the side of the back surface 3b of the solar panel 3.

Here, one solar panel 3 is, although not particularly shown in the drawing, formed of cells (solar cell elements) arranged for a necessary number, protected by resin, reinforced glass or the like, and fixed externally by, for example, a frame made of aluminum or the like.

The inverter 1 can be detachably fixed to the frame 4. In this case, although the frame 4 is not limited to a particular structure, the frame 4 of the present embodiment is assumed to have a shape projecting to the side of the back surface 3b of the solar panel 3. The inverter 1 has such a structure as to be placed within a projection width of the frame 4 having a projecting shape. Note that the inverter 1 may be fixed to a stand instead. The stand may be provided, for example, as a scaffold for setting the solar panel 3 on a roof, in a field or the like.

In the solar panel 3, the DC power generated by the plurality of solar cell elements is supplied to the inverter 1 through a terminal box 5 provided on the back surface of the solar panel 3. The supplied DC power is input to the inverter 1 from a DC terminal 17 which will be described later. The inverter 1 comprises an electronic component which will be described later such as, for example, an inverter circuit 7. The DC power input to the inverter 1 is converted into AC power by the inverter circuit 7. The AC power is then output from an AC terminal 18 which will be described later.

"Inverter 1"

As shown in FIGS. 1 to 4, the inverter 1 comprises a housing 6, the inverter circuit 7, the wireless communication module 8, the projection mechanism 9 and a fixing mechanism. The entire housing 6 (or at least a corner 16 which will be described later) is made of a metal material. Here, a material such as aluminum or stainless steel can be applied as the metal material.

The inverter circuit 7 comprises an inverter unit 7a and a control unit 7b. The inverter unit 7a comprises a circuit configured to convert DC power into AC power. The control unit 7b is configured to control the inverter unit 7a. The control unit 7b comprises a control circuit. Here, the control of the inverter unit 7a is assumed to include, for example, routine control to convert DC power into AC power, control of power generation status (such as a power generation amount, a power generation timing and the like) of the inverter unit 7a and the like.

"Wireless Communication Module 8"

The wireless communication module 8 comprises a wireless circuit 10, an antenna 11 and a substrate 12. The antenna 11 is configured to transmit or receive a signal to perform wireless control of the inverter circuit 7 (inverter unit 7a and control unit 7b). The wireless circuit 10 is configured, for example, to input a signal received from the antenna 11 to the control unit 7b or to transmit a signal output from the control unit 7b to the antenna 11. The control unit 7b is configured to control the operation of the inverter unit 7a based on a signal input from the wireless circuit. Further, the control unit 7b outputs a signal of the operation status of the inverter unit 7a to the wireless circuit. The wireless circuit 10 and the antenna 11 are provided on the same substrate 12. For example, the wireless circuit 19 and an antenna pattern are formed on the same substrate 12.

Further, the wireless communication module 8 is conforming to a sub-gigahertz band wireless communication. The sub-gigahertz band wireless communication is a frequency band of 1 GHz or less. A frequency band available as the sub-gigahertz band varies from country to country. In Japan, a communication frequency band of 920-MHz is set as the sub-gigahertz band. In this case, the wireless communication module 8 can perform a 920-MHz band wireless communication with a gateway 27 which will be described later.

According to the 920-MHz band wireless communication, it is possible to improve the traveling distance of radio waves with lower power consumption as compared to a wireless communication in the 2.4-GHz band. In this way, a large-scale multi-hop network can be built. Further, the 920-MHz band wireless communication exhibits better wraparound characteristics of radio waves as compared to the 2.4-GHz band wireless communication, which ensures a stable communication, for example, even in a place where there are walls or obstacles.

"Housing 6"

The housing 6 accommodates the inverter circuit 7 and the wireless communication module 8. The housing 6 comprises a lid 6a and a container 6b. The container 6b comprises an open portion (not shown). The inverter circuit 7 and the wireless communication module 8 can be accommodated in the container 6b from the opening. The opening of the container 6b can be closed by the lid 6a. In a state where the opening is closed by the lid 6a, the internal space (internal space for accommodating the inverter circuit 7 and the wireless communication module 8) is kept sealed off from the outside.

The housing 6 comprises two surfaces (for example, flat surfaces) 13 and 14, and a plurality of side surfaces (for example, flat side surfaces) 15. These two flat surfaces 13 and 14 are arranged in such a manner as to face each other. The side surfaces 15 are arranged in such a manner as to surround a space formed between these two surfaces 13 and 14. Here, the flat surface 14 is assumed to be the outer surface of the lid 6a, and the flat surface 13 is assumed to be the outer surface of the container 6b. The side surfaces 15 are assumed to be a region including the side surfaces of the lid 6a and the side surfaces of the container 6b.

The housing 6 comprises a plurality of corners 16. The corners 16 are formed between adjacent side surfaces 15 of the plurality of side surfaces 15. According to the above-described structure, it is possible to define the housing 6 as a hexahedron having an outline of a polygon (such as a quadrangle, a pentagon, a hexagon or the like). In the drawing, the housing 6 assumed to be a hexahedron having a quadrangular outline is shown as an example. In this case, the corner 16 is formed by adjacent side surfaces 15 and having a right angle. Note that the corner 16 may have a curvature.

The housing 6 is provided with a pair of DC terminals 17 and an AC terminal 18. The DC terminals 17 are configured to input DC power to the inverter circuit 7. The AC terminal 18 is configured to output AC power from the inverter circuit 7. The DC terminals 17 and the AC terminal 18 are provided on the side surfaces 15 of the housing 6. The side surface 15 provided with the DC terminal 17 and the side surface 15 provided with the AC terminal are orthogonal to each other.

The DC terminals 17 and the AC terminal 18 are electrically connected to the inverter unit 7a of the electronic component 7. The DC terminals 17 are electrically connected to the above-described terminal box 5 via a pair of DC cables 19. From the AC terminal 18, an AC cable extends.

In this structure, DC power generated by the solar panel 3 is supplied from the terminal box 5 to the inverter unit 7a via the DC cables 19 and the DC terminal 17. In the inverter unit 7a, the DC power is converted into AC power. The AC power is then supplied from the AC terminal 18 to the outside (for example, an AC collector 29 [FIG. 5]) via the AC cable 20.

"Projection Mechanism 9"

The housing 6 is provided with the projection mechanism 9. The projection mechanism 9 is configured to project at least a part of the above-described antenna 11 into the outside of the housing 6. A projection mechanism 9 is provided in a portion of the housing 6 other than the corners 16. In this case, the portion other than the corners 16 may be, for example, the two flat surfaces 13 and 14 or the side surfaces 15. In the drawing, a structure in which the projection mechanism 9 is provided on the side surface 15 is shown as an example. More specifically, the projection mechanism 9 is provided on the side surface 15 provided with the DC terminal 17.

The projection mechanism 9 comprises an opening 21 and a cover 22. The opening 21 is formed in such a manner as to penetrate through a part of the housing 6 (side surface 15). The side surface (first side surface) 15 provided with the opening 21 is different from the side surface (second side surface) 15 provided with the AC terminal 18. In this case, the first side surface 15 is orthogonal to the second side surface 15. The opening 21 and the DC terminal 17 are provided on the same side surface (that is, first side surface). The distance between the opening 21 and the second surface 15 is shorter than the distance between the DC terminal 17 and the second surface.

Further, the opening 21 is set to be in such a shape or a size as to project at least a part of the antenna 11 into the outside of the housing 6. Here, the part of the antenna 11 can be defined, for example, as a part of the antenna portion 11b of the antenna pattern printed on the substrate 12 (portion configured to transmit and receive radio waves) extending from a feed point 11a. In the drawing, a state in which a part of the antenna portion 11b printed on the substrate 12 projects together with the substrate 12 from the opening 21 is shown as an example.

Further, the cover 22 is provided in such a manner as to cover the opening 21. The cover 22 covers at least the part of the antenna 11 projecting into the outside of the housing 6 through the opening 21. The cover 22 is formed of a nonmetal material. Here, a material such as ABS, polycarbonate or the like can be applied as the nonmetal material.

More specifically, the cover 22 comprises a fixed portion 22a and a cover body 22b. The fixed portion 22a is fixed to the housing 6 in such a manner as to surround the opening 21. As a method of fixing the fixed portion 22a to the housing 6, for example, a method of affixing the fixed portion 22a on the housing 6, a method of screwing the fixed portion 22a on the housing 6, or the like can be applied. The cover body 22b is formed continuously from the fixed portion 22a. The cover body 22b has such an outline as to have the interior bulging outward.

In this structure, the fixed portion 22a is fixed to the housing 6 in such a manner as to surround the opening 21. In this way, a part of the antenna 11 projected into the outside of the housing 6 through the opening 21 can be accommodated in the cover body 22b. Consequently, the antenna 11 can be kept under an environment sealed off from the outside. As a result, it is possible to prevent early deterioration of the antenna 11 or the wireless communication module 8.

"Fixing Mechanism"

The housing 6 is provided with the fixing mechanism. The fixing mechanism is configured to detachably fix the inverter 1 to the frame 4. The fixing mechanism comprises a plurality of fixed portions 23 and a plurality of fixing screws 24. The fixed portions 23 are arranged along the side surfaces 15 of the housing 6 at intervals. The fixed portions 23 comprise screw holes 25. The fixing screws 24 are screwed into the screw holes 25.

The fixed portions 23 are provided on the side surfaces 15 not provided with the projection mechanism 9, the DC terminals 17 and the AC terminal 18. In the present embodiment, two fixed portions 23 are provided on the side surface 15 opposite to the side surface 15 provided with the projection mechanism 9 and the DC terminal 17, and other two fixed portions 23 are provided on the side surface 15 opposite to the side surface 15 provided with the AC terminal 18. These fixed portions 23 (screw holes 25) are provided in such a manner as to correspond to the positions of a plurality of fixing holes 4h (FIG. 4) formed in the frame 4.

In this structure, for example, the fixed portions 23 are provided on the back surface side of the frame 4 provided with the fixing holes 4h. In this state, the screw holes 25 are placed in such a manner as to face the fixing holes 4h. The fixing screws 24 are inserted into the fixing holes 4h from the front surface side of the frame 4. The fixing screws 24 are then screwed into the screw holes 25. In this way, the fixed portions 23 are fixed to the frame 4. As a result, the inverter 1 can be fixed to the frame 4.

In this state, the inverter 1 is placed within the projection width of the frame 4. In this case, it becomes possible, for example, under such an environment as to accommodate and manage a plurality of photovoltaic apparatuses 2 in one place, to pile the photovoltaic apparatuses 2 (solar panels 3) without a gap therebetween. In this way, it is possible to make an accommodation and management space compact.

Further, with the fixing mechanism, a gap 26 is formed between the inverter 1 and the solar panel 3 in a state where the inverter 1 is fixed to the frame 4. It becomes possible by the gap 26 to prevent in advance such a situation where the inverter 1 contacts and thus damages the solar panel 3. Still further, in a state where the inverter 1 is fixed to the frame 4, the projection mechanism 9 can be provided in such a position as to avoid interference with the plurality of cables 19 and 20 connected to the DC terminals 17 and the AC terminal 18.

Effect Produced by Embodiment

According to the present embodiment, (the entire or at least the corner 16 of) the housing 6 is formed of a metal material. Further, the projection mechanism (opening 21) configured to project at least a part of the antenna 11 into the outside of the housing 6 is provided on a portion other than the corners 16 of the housing 6, namely, on the side surface 15. In this way, a certain strength (rigidity) of the housing 6 can be maintained. In particular, in the case of forming the opening 21 on the side surface 15, the notch of the housing 6 can be made smaller as compared to the case of forming the opening 21 through the corner 16. Therefore, the strength (rigidity) of the housing 6 can be ensured easily for the entire housing 6.

Further, according to the present embodiment, it is possible by providing the projection mechanism (opening 21) with the housing 6 to project at least a part of the antenna 11 into the outside of the housing 6. In this case, at least a part of the antenna 11 is exposed to the outside of the metallic housing 6. In this state, the exposed portion of the antenna 11 is less likely to be influenced by the housing 6 (metal). Further, the exposed portion of the antenna 11 is separated from the inverter circuit 7 (inverter unit 7a). Therefore, the exposed portion of the antenna 11 is less likely to be influenced by noises produced by the inverter circuit 7 (inverter unit 7a). As a result, it is possible to realize the inverter 1 (wireless communication module 8) which can achieve excellent antenna performance and wireless performance.

Still further, according to the present embodiment, a 920-MHz band wireless communication can be established between the wireless communication module 8 and the gateway 27 via the antenna 11 which achieves excellent antenna performance and wireless performance. In this way, it is possible to control or monitor the power generation status (such as a power generation amount, a power generation timing and the like) of the inverter circuit 7 (inverter unit 7a) with high accuracy.

Still further, according to the present embodiment, a wireless communication is directly performed between the wireless communication module 8 and the gateway 27. Therefore, for example, in a power generation system comprising a plurality of photovoltaic apparatuses 2 (solar panels 3) as shown in FIG. 5, the photovoltaic apparatuses 2 can be controlled individually by the single gateway 27. For example, even if the power generation by one photovoltaic apparatus 2 (solar panel 3) decreases, it is possible to compensate the decrease by individually controlling the power generation of the other photovoltaic apparatuses 2 (solar panels 3). In this way, it is possible to stabilize the amount of power collected to the AC collector 29 from the AC cable 20 through a junction cable 28.

Note that the above-described embodiment is in no way restrictive and the following modified examples also fall within the same technical scope.

First Modified Example

Figure 6:
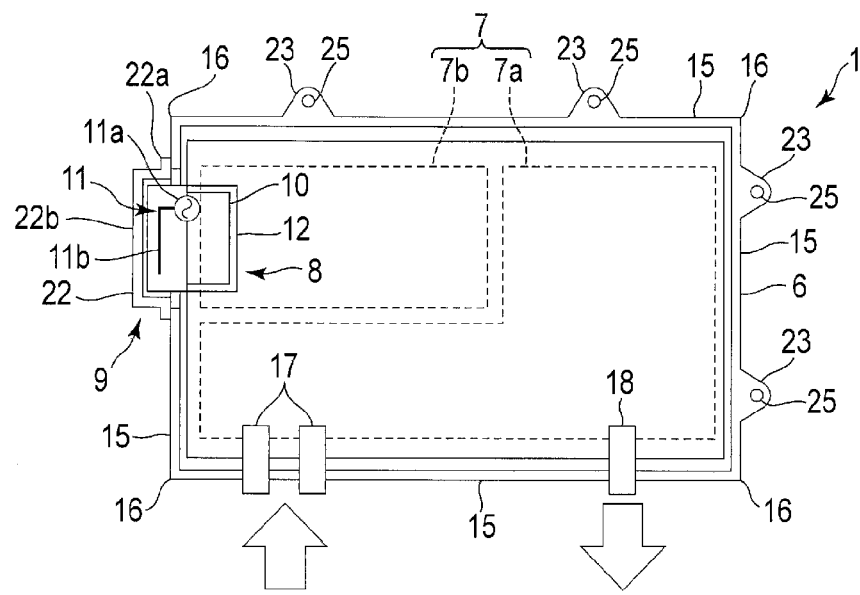
FIG. 6 is an exemplary plan view of the internal structure of an inverter of a first modified example.
Figure 7:
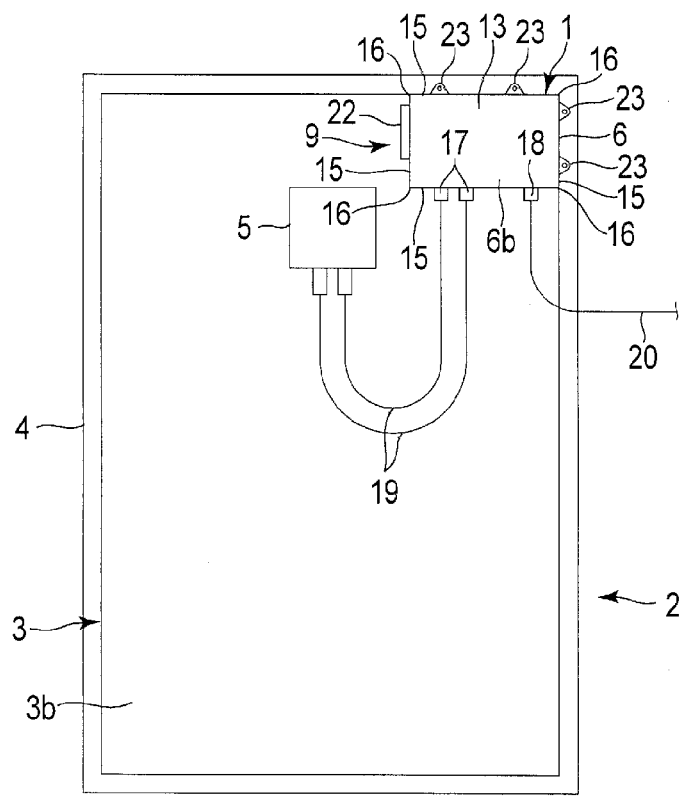
FIG. 7 is an exemplary plan view of the back surface side of a photovoltaic apparatus of a first modified example.

FIG. 6 illustrates an inverter 1 of the first modified example. FIG. 7 illustrates a photovoltaic apparatus 2 comprising the inverter 1 of the first modified example. In the inverter 1 of the first modified example, a pair of DC terminals 17 and an AC terminal 18 are provided side by side along one long side surface 15. Based on the layout of the DC terminals 17 and the AC terminal 18, an inverter circuit 7 (inverter unit 7a and control unit 7b) is provided.

A projection mechanism 9 is provided in a portion of a housing 6 other than corners 16. Fixed portions 23 are provided on the side surfaces 15 not provided with the projection mechanism 9, the DC terminals 17 and the AC terminal 18. Note that structures other than those described above and effects are similar to the structures of and the effects produced by the above-described embodiment and thus descriptions thereof are omitted.

Second Modified Example

Figure 9:
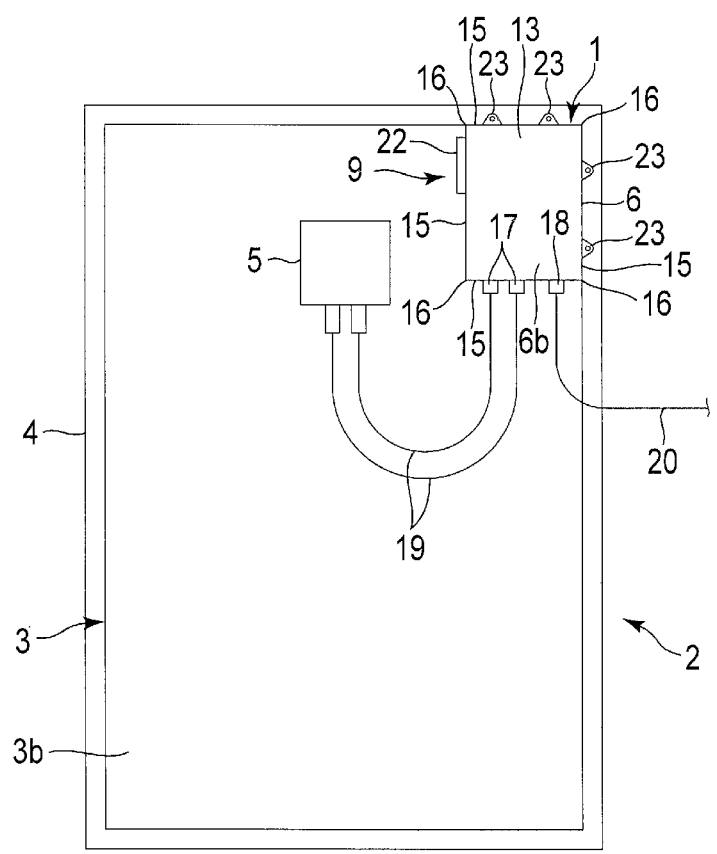
FIG. 9 is an exemplary plan view of the back surface side of a photovoltaic apparatus of a second modified example.

FIG. 8 illustrates an inverter 1 of the second modified example. FIG. 9 illustrates a photovoltaic apparatus 2 comprising the inverter 1 of the second modified example. In the inverter 1 of the second modified example, a pair of DC terminals 17 and an AC terminal 18 are provided side by side along one short side surface 15. Based on the layout of the DC terminals 17 and the AC terminal 18, an inverter circuit 7 (inverter unit 7a and control unit 7b) is provided.

A projection mechanism 9 is provided in a portion of a housing 6 other than corners 16. Fixed portions 23 are provided on the side surfaces 15 not provided with the projection mechanism 9, the DC terminals 17 and the AC terminal 18. Note that structures other than those described above and effects are similar to the structures of and the effects produced by the above-described embodiment and thus descriptions thereof are omitted.

Third Modified Example

Figure 11:
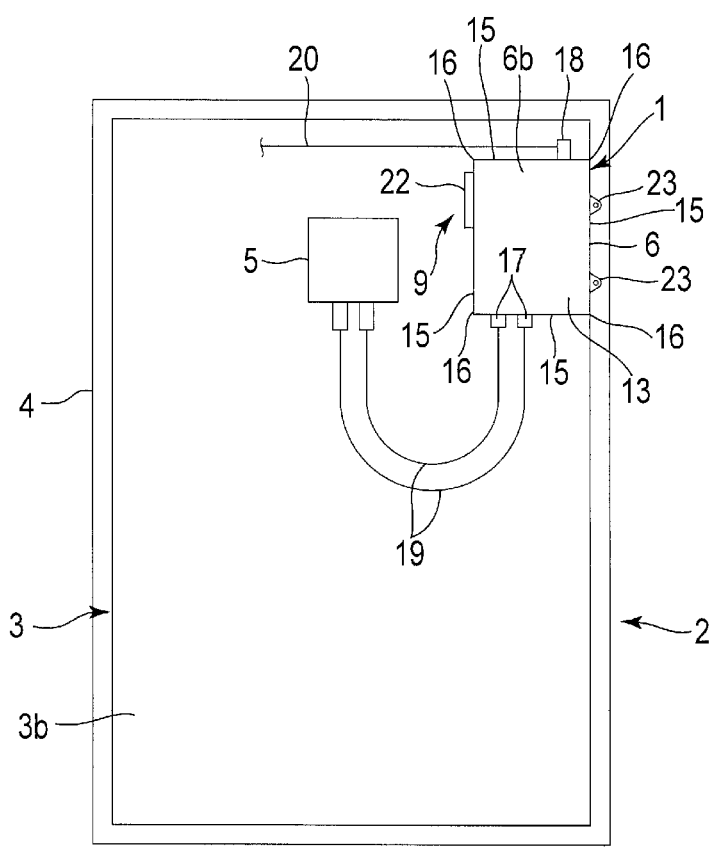
FIG. 11 is an exemplary plan view of the back surface side of a photovoltaic apparatus of a third modified example.

FIG. 10 illustrates an inverter 1 of the third modified example. FIG. 11 illustrates a photovoltaic apparatus 2 comprising the inverter 1 of the third modified example. In the inverter 1 of the third modified example, a pair of DC terminals 17 and an AC terminal are provided on short side surfaces 15 facing each other. Based on the layout of the DC terminals 17 and the AC terminal 18, an inverter circuit 7 (inverter unit 7a and control unit 7b) is provided.

A projection mechanism 9 is provided in a portion of a housing 6 other than corners 16. Fixed portions 23 are provided on the side surfaces 15 not provided with the projection mechanism 9, the DC terminals 17 and the AC terminal 18. Note that structures other than those described above and effects are similar to the structures of and the effects produced by the above-described embodiment and thus descriptions thereof are omitted.

Fourth Modified Example

FIG. 12 illustrates an inverter 1 of the forth modified example. FIG. 13 illustrates a photovoltaic apparatus 2 comprising the inverter 1 of the fourth modified example. In the inverter 1 of the fourth modified example, a pair of DC terminals 17 and an AC terminal 18 are provided on short sides 15 facing each other. Based on the layout of the DC terminals 17 and the AC terminal 18, an inverter circuit 7 (inverter unit 7a and control unit 7b) is provided.

A projection mechanism 9 is provided in a portion of a housing 6 other than corners 16. Fixed portions 23 are provided on the side surfaces 15 not provided with the projection mechanism 9, the DC terminals 17 and the AC terminal 18.

In the present modified example, a wireless circuit 10 and an antenna 11 are arranged separately from each other. In the drawing, a structure in which the wireless circuit 10 and the antenna 11 are provided on different substrates 12a and 12b is shown as an example. That is, the wireless circuit 10 is provided on one substrate 12a, and the antenna 11 is provided on the other substrate 12b. Both substrates 12a and 12b (that is, the wireless circuit 10 and the antenna 11) are electrically connected to each other by a coaxial cable 30. Note that structures other than those described above and effects are similar to the structures of and the effects produced by the above-described embodiment and thus descriptions thereof are omitted.

Fifth Modified Example

In the above-described embodiment and the first to fourth modified examples, the antenna 11 is preferably provided in such a manner as to prevent the antenna 11 from overlapping with the frame 4 in a state where the inverter 1 is detachably fixed to the frame 4. That is, in the housing 6, the antenna 11 is preferably projected from a portion (side surface 15) other than a portion (side surface 15) adjacent to the frame 4. In other words, the antenna 11 is preferably projected from such a portion (side surface 15) as to avoid the frame 4. In this way, degradation of antenna performance by the influence of the frame 4 can be prevented.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An inverter comprising:
   a housing comprising a corner and made of a metal material;

a DC terminal on a first side surface of the housing other than the corner, the DC terminal configured to receive generated DC power;

an inverter circuit in the housing, the inverter circuit comprising an inverter unit and a control unit configured to control the inverter unit, the inverter circuit configured to convert the DC power into AC power;

an AC terminal on a second side surface adjacent to the first side surface of the housing, the AC terminal configured to output the AC power output from the inverter circuit;

a wireless communication transceiver in the housing, the wireless communication transceiver comprising an antenna, a wireless circuit and a substrate on which the antenna and the wireless circuit are formed, the wireless communication transceiver configured to input a first signal received from an external device to the control unit of the inverter circuit by the antenna and transmit a second signal output from the control unit to the external device by the antenna, to control the inverter circuit; and a protruding structure protruding outside the first side surface of the housing, the protruding structure separated from the inverter unit of the inverter circuit, the protruding structure configured to store at least the antenna of the wireless communication transceiver, wherein the inverter is detachably fixed to a frame, and the antenna is placed in a position to avoid overlapping with the frame in the state where the inverter is detachably fixed to the frame.

2. The inverter of claim 1, wherein the protruding structure comprises an opening outside the first side surface of the housing, the opening penetrating through a part of the first side surface of the housing, and a cover covering the opening and made of a non-metallic material, and the cover covers the opening to cover the antenna extending out of the housing.

3. The inverter of claim 1, wherein the protruding structure is located in a position to avoid interference with a plurality of cables connected to the AC terminal on the second side surface.

4. The inverter of claim 1, wherein the wireless communication transceiver further comprises an antenna pattern and the wireless circuit on the substrate, and a part of the substrate on which the antenna pattern is printed protrudes into the protruding structure.

5. The inverter of claim 1, wherein fixed portions are on a third side surface and a fourth side surface of the housing, the third side surface and the fourth side surface of the housing being different from the first side surface and the second side surface of the housing, the fixed portions configured to fix the housing.

6. An inverter, comprising:

a housing comprising a corner and made of a metal material;

a DC terminal on a first side surface of the housing other than the corner, the DC terminal configured to receive generated DC power;

an inverter circuit in the housing, the inverter circuit comprising an inverter unit and a control unit configured to control the inverter unit, the inverter circuit configured to convert the DC power into AC power;

a wireless communication transceiver in the housing, the wireless communication transceiver comprising an antenna, a wireless circuit and a substrate on which the antenna and the wireless circuit are formed, the wireless communication transceiver configured to input a first signal received from an external device to the control unit of the inverter circuit by the antenna and transmit a second signal output from the control unit to the external device by the antenna, to control the inverter circuit;

a protruding structure protruding outside a second side surface adjacent to the first side surface of the housing, the protruding structure separated from the inverter unit of the inverter circuit, the protruding structure configured to store at least the antenna of the wireless communication transceiver; and an AC terminal on the first side surface or a third side surface adjacent to the second side surface of the housing, the AC terminal configured to output the AC power output from the inverter circuit, wherein the inverter is detachably fixed to a frame, and the antenna is placed in a position to avoid overlapping with the frame in the state where the inverter is detachably fixed to the frame.

7. The inverter of claim 6, wherein the protruding structure comprises an opening outside the second side surface of the housing, the opening penetrating through a part of the second side surface of the housing, and a cover covering the opening, and the cover covers the opening to cover the antenna extending out of the housing.

8. The inverter of claim 6, wherein the protruding structure is located in a position to avoid interference with a plurality of cables connected to the AC terminal on the first side surface or the third side surface.

9. The inverter of claim 6, wherein the wireless communication transceiver further comprises an antenna pattern and the wireless circuit on the substrate, and a part of the substrate on which the antenna pattern is printed protrudes into the protruding structure.

10. The inverter of claim 6, wherein fixed portions are on surfaces of the housing which are not provided with the AC terminal, the DC terminal and the protruding structure, the fixed portions configured to fix the housing.

11. A photovoltaic apparatus comprising:

a solar panel configured to integrally support a plurality of solar cell elements by a frame; and an inverter fixed to the frame, the inverter configured to convert DC power generated by the solar cell elements into AC power, wherein the inverter comprises:

a housing comprising a corner and made of a metal material;

a DC terminal on a first side surface of the housing other than the corner, the DC terminal configured to receive the generated DC power;

an inverter circuit in the housing, the inverter circuit comprising an inverter unit and a control unit configured to control the inverter unit, the inverter circuit configured to convert the DC power into the AC power;

an AC terminal on a second side surface adjacent to the first side surface of the housing, the AC terminal configured to output the AC power output from the inverter circuit;

a wireless communication transceiver in the housing, the wireless communication transceiver comprising an antenna, a wireless circuit and a substrate on which the antenna and the wireless circuit are formed, the wireless communication transceiver configured to input a first signal received from an external device to the control unit of the inverter circuit by the antenna and transmit a second signal output from the control unit to the external device by the antenna, to control the inverter circuit; and a protruding structure protruding outside the first side surface of the housing, the protruding structure separated from the inverter unit of the inverter circuit, the protruding structure configured to store at least the antenna of the wireless communication transceiver, wherein the inverter is detachably fixed to the frame, and a gap is between the inverter and the solar panel when the inverter is in the fixed state, and the antenna is placed in a position to avoid overlapping with the frame in the state where the inverter is detachably fixed to the frame.

12. The photovoltaic apparatus of claim 11, wherein a portion of the antenna extending out the housing is located on the other side than a portion adjacent to the frame.

* * * * *